(12) United States Patent
Mohalik et al.

(10) Patent No.: US 8,484,009 B2
(45) Date of Patent: Jul. 9, 2013

(54) TIMING ANALYSIS USING FORMAL METHODS

(75) Inventors: Swarup K. Mohalik, Karnataka (IN); Rajeev Ariyattu Chandrasekharan, Natick, MA (US); Manoj G. Dixit, Karnataka (IN); Ramesh Sethu, Bangalore (IN); Devesh B Chokshi, Gujrat (IN)

(73) Assignee: GM Global Technology Operations LLC, Detroit, MI (US)

( * ) Notice: Subject to any disclaimer, the term of this patent is extended or adjusted under 35 U.S.C. 154(b) by 505 days.

(21) Appl. No.: 12/779,999

(22) Filed: May 14, 2010

(65) Prior Publication Data

US 2011/0282640 A1 Nov. 17, 2011

(51) Int. Cl.
*G06F 17/50* (2006.01)

(52) U.S. Cl.
USPC .......................................................... 703/19

(58) Field of Classification Search
USPC .......................................................... 703/19
See application file for complete search history.

(56) References Cited

PUBLICATIONS

Suman et al.; Timed Automata with Integer Resets: Language Inclusion and Expressiveness; Technical Report TIFR-SPKM-GM-2008; pp. 1-22; Jul. 2008.*
Alur et al.; Automata for Modeling Real-Time Systems; Proceedings., Fifth Annual IEEE Symposium on Logic in Computer Science, 1990. LICS '90; pp. 414-425; 1990.*
Lamport; Real-Time Model Checking is Really Simple; in CHARME 2005 (Borrione, Paul Eds.), LNCS 3725, pp. 162-175, 2005.*
Etessami, Lecture notes on "Automata-theoretic Model Checking", SFM-02:MC 2nd International School on Formal Methods for the Design of Computer, Communication and Software Systems: Model Checking; 2002; pp. 1-46.*
Holzmann: Automata-based Model Checking; Proc. WIFT98, Boca Raton Fl. USA, Oct. 1998, (invited); pp. 1-80.*
Leue; Automata-based Model Checking (Chapter 5, course notes for class "Design of Reactive Systems" (summer, 2001), handouts supplied by professor (the author); pp. 1-35; 2001.*
Alur et al.; A theory of timed automata; Theoretical Computer Science 126 (1994) 183-235, Elsevier.*
Zeng et al.; Stochastic Analysis of CAN-Based Real-Time Automotive Systems; IEEE Transactions on Industrial Informatics, vol. 5, No. 4, Nov. 2009; pp. 388-401.*
Mohalik et al.; Model Checking based Analysis of End-to-end Latency in Embedded, Real-time Systems with Clock Drifts; DAC 2008, Jun. 8-13, 2008, Anaheim, California; pp. 296-299.*

(Continued)

*Primary Examiner* — Hugh Jones

(74) *Attorney, Agent, or Firm* — Quinn Law Group, PLLC

(57) ABSTRACT

A method and tools for providing precise timing analysis scalable to industrial case studies with large numbers of tasks and messages are provided, including the capability to model and analyze task and message response times; ECU usage; bus usage; end-to-end latency of task/message chains; and timing synchronization problems in task/message graphs. System tasks and messages are modeled in a formalism known as calendar automaton. Models are written in a modeling language such as Promela and instrumented with code specific to the analysis specification. Models and instrumentation are automatically generated from the system description and analysis specification. The system model is subjected to exhaustive state space exploration by a compatible model checker, such as SPIN. During exploration, the instrumented code produces results for different timing analyses. Optimization techniques are provided to generate models which require less memory and time for analysis and make the method scalable to large, industrial case studies.

17 Claims, 6 Drawing Sheets

PUBLICATIONS

Gadkari et al.; AutoMOTGen: Automatic Model Oriented Test Generator for Embedded Control Systems; CAV 2008, LNCS 5123, Springer-Verlag Berlin Heidelberg 2008 (Gupta and Malik (Eds.):); pp. 204-208, 2008.*

Dutertre et al.; Modeling and Verification of a Fault-Tolerant Real-time Startup Protocol using Calendar Automata; Presented at FORMATS-FTRTFT 2004, Grenoble, France, 2004; pp. 1-16.*

Dziobek et al.; AUTOSAR in the development process—procedure for introducing model-based AUTOSAR function development into production projects, dSPACE Magazine, Jan. 2008; pp. 6-13.*

Saha et al.: Timeout and Calendar Based Finite State Modeling and Verification of Real-Time Systems; Namjoshi et al. (Eds.): ATVA 2007, LNCS 4762, pp. 284-299, 2007; Springer-Verlag Berlin Heidelberg 2007.*

Saha et al.: A Finite State Analysis of Time-triggered CAN (TTCAN) Protocol using Spin; Proceedings of the International Conference on Computing: Theory and Applications (ICCTA'07); 2007; pp. 1-5.*

Saha et al.: Modeling and Verification of TTCAN Startup Protocol Using Synchronous Calendar; 2007 IEEE; Fifth IEEE International Conference on Software Engineering and Formal Methods; pp. 69-79.*

M. Joseph, P. Pandya, "Finding Response Times in a Real-Time System", The Computer Journal, 1986, vol. 29, No. 5, pp. 390-395.

K. Tindell, A. Burnes, A. Wellings, "Calculating Controller Area Network (CAN) Message Response Times", University of York, Department of Computer Science. 1995, pp. 1163-1169 York, England.

A. Davare, Q. Zhu, M. Di Natale, C. Pinello, S. Kanajan, A. Sangiovanni-Vincentelli, "Period Optimization for Hard Real-time Distributed Automotive Systems", DAC 2007, pp. 278-283, San Diego, CA, USA.

H. Zeng, A. Davare, AL. Sangiovanni-Vincentelli, S. Sonalkar, S. Kanajan, C. Pinello, "Design Space Exploration of Automotive Platforms in Metropolis", SAE International, 2006-06AE-79, pp. 1-13.

T. Pop, P. Eles, Z. Peng, "Holistic Scheduling and Analysis Mixed Time/Event-Triggered Distributed Embedded Systems", CODES'02, pp. 187-192, Estes Park, CO, USA.

E. Wandeler, L. Thiele, M. Verhoef, P. Lieverse. "System Archietecture Evaluation using Modular Performance Analysis: A Case Study", Springer-Verlag 2006, pp. 649-667, vol. 8, No. 6, Luchthavenweg, Eindohoven, The Netherlands.

L. Phan, S. Chakraborty, P. Thiagarajan, L. Thiele, "Composing Functional and State-based Performance Models for Analyzing Heterogeneous Real-Time Systems", RTSS, 2007, pp. 343-352.

H. Zeng, M. Di Natale, P. Gusto, A. Sangiovanni-Vincentelli, "Stochastic Analysis of Distributed Real-time Automotive Systems", IEEE Transactions on Industrial Informatics, 2009, vol. 5, No. 4, pp. 1-29.

E. Fersman, L. Mokrushin, P. Pettersson, W. Yi, "Schedulability Analysis of Fixed-Priority Systems Using Timed Automata", Theorectical Computer Science 2006, vol. 354, No. 2, pp. 301-317, Elsevier.

S. Vestal, "Formal Verification of the MetaH Executive using Linear Hybrid Automata", IEEE Real Time Technology and Aplications Symposium. 2000, pp. 134-144.

T. Amnell, E. Fersman, L. Mokrushin, P. Pettersson, W. Yi, "Times: A Tool for Schedulability Analysis and Code Generation of Real-Time Systems", FORMATS 2003, pp. 60-72.

Z. Gu, "Timing Analysis of Distributed End-to-End Task Graphs with Model-Checking", EUC 2005, pp. 214-223.

S. Mohalik, A.C. Rajeev, M. G. Omit, S. Ramesh, P. V. Suman, P. K. Pandya, S. Jiang, "Model Checking Based Analysis of End-to-End Latency in Embedded, Realtime Systems with Clock Drifts", DAC 2008, pp. 296-299, Anaheim, CA, USA.

C. Ferdinand, R. Heckmann, K. Richter, P. Frey, "Timing Correctness and model-Based Software Development for Safety-Critical Automotive Applications—An Integrated, Tool-Supported Workflow", Automotive-Safety & Security, 2008, pp. 1-15.

B. Dutertre, M. Sorea, "Modeling and Verification of a Fault-Tolerant Real-Time Startup Protocol Using Calendar Automata", FORMATS/FTRTFT 2004, pp. 199-214.

T. Henzinger, P. Ho, H. Wong-Toi, "HYTECH: A Model checker for Hybrid Systems," Software Tools for Technology Transfer, vol. 1, 1997, pp. 110-122.

* cited by examiner

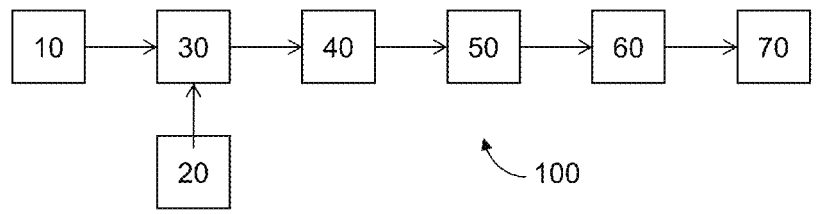
FIG. 1
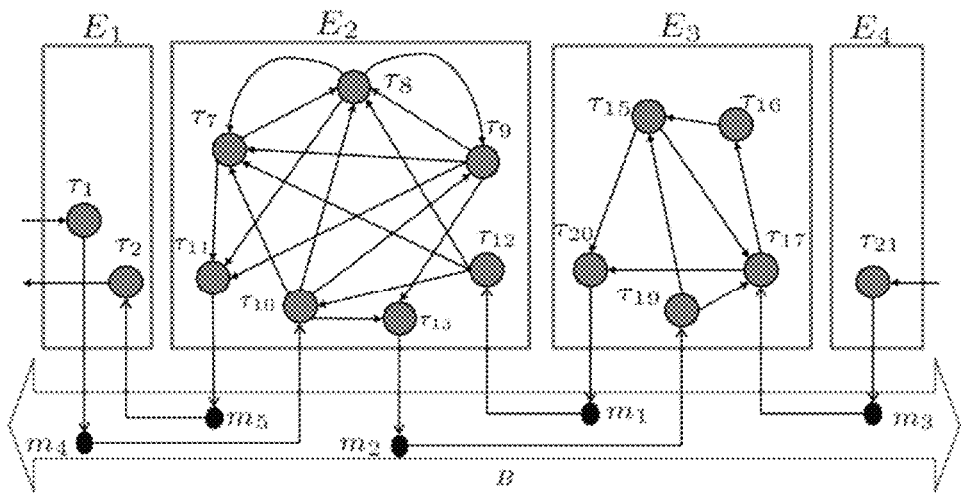
FIG. 2
| No. | Chain |
|---|---|
| 1. | $\tau_1, m_4, \tau_{10}, \tau_8, \tau_9, \tau_{13}, m_2, \tau_{19}, \tau_{15}, \tau_{20}, m_1, \tau_{12}, \tau_7, \tau_{11}, m_5, \tau_2$ |
| 2. | $\tau_{21}, m_3, \tau_{17}, \tau_{16}, \tau_{15}, \tau_{20}, m_1, \tau_{12}, \tau_8, \tau_9, \tau_{11}, m_5, \tau_2$ |
| 3. | $\tau_1, m_4, \tau_{10}, \tau_9, \tau_7, \tau_8, \tau_{11}, m_5, \tau_2$ |
| 4. | $\tau_{21}, m_3, \tau_{17}, \tau_{20}, m_1, \tau_{12}, \tau_7, \tau_{11}, m_5, \tau_2$ |
| 5. | $\tau_1, m_4, \tau_{10}, \tau_7, \tau_8, \tau_9, \tau_{11}, m_5, \tau_2$ |
FIG. 4

Algorithm (FIG. 6):

1. $(ready_i, 0) \in C \Rightarrow$
2. $C \leftarrow (C \setminus \{(ready_i, 0)\}) \cup \{(ready_i, T_i)\}$
3. $response\_time_i \leftarrow 0$
4. if $\exists (finish_k, e_k) \in C$ then
5.   if $\tau_i < \tau_k$ then
6.     $C \leftarrow C \cup \{(start_i, e_k)\}$
7.     $remain\_exec\_time_i \leftarrow E_i$
8.   else
9.     $C \leftarrow (C \setminus \{(finish_k, e_k)\}) \cup \{(start_k, E_k), (start_i, 0)\}$
10.     $remain\_exec\_time_k \leftarrow e_k$
11.     $remain\_exec\_time_i \leftarrow E_i$
12.     if $\tau_k = o_p \, (0 \leq p \leq i-1)$ then
13.       $was\_preempted_p \leftarrow \text{TRUE}$
14. else
15.   $C \leftarrow C \cup \{(start_i, 0)\}$
16.   $remain\_exec\_time_i \leftarrow E_i$
17. if $\tau_i = a_0$ then
18.   if $next > 0$ then
19.     $input \leftarrow 0$
20.   else
21.     $\{input \leftarrow 1; next \leftarrow 1\}$ or $\{input \leftarrow 0\}$

*FIG. 6*

| ECU/Bus | $a_i$ | $\tau_i$ | $O_i$ (ms) | $P_i$ (ms) | $E_i$ (ms) |
|---|---|---|---|---|---|
| $E_1$ | $\tau_1$ | 0 | 0 | 10 | 0.01 |
| | $\tau_2$ | 1 | 0 | 10 | 0.01 |
| | $\tau_3$ | 2 | 0 | 15 | 0.8 |
| | $\tau_4$ | 3 | 0 | 40 | 1.4 |
| | $\tau_5$ | 4 | 0 | 30 | 0.2 |
| | $\tau_6$ | 5 | 0 | 15 | 0.6 |
| $E_2$ | $\tau_7$ | 0 | 0 | 100 | 0.028 |
| | $\tau_8$ | 1 | 0 | 50 | 0.463 |
| | $\tau_9$ | 2 | 0 | 10 | 0.017 |
| | $\tau_{10}$ | 3 | 0 | 10 | 0.363 |
| | $\tau_{11}$ | 4 | 0 | 10 | 0.287 |
| | $\tau_{12}$ | 5 | 0 | 10 | 6.569 |
| | $\tau_{13}$ | 6 | 0 | 10 | 0.01 |
| $E_3$ | $\tau_{14}$ | 0 | 0 | 100 | 0.01 |
| | $\tau_{15}$ | 1 | 0 | 50 | 0.01 |
| | $\tau_{16}$ | 2 | 0 | 10 | 0.02 |
| | $\tau_{17}$ | 3 | 0 | 10 | 0.01 |
| | $\tau_{18}$ | 4 | 0 | 10 | 0.01 |
| | $\tau_{19}$ | 5 | 0 | 10 | 0.01 |
| | $\tau_{20}$ | 6 | 0 | 10 | 0.01 |
| $E_4$ | $\tau_{21}$ | 0 | 0 | 10 | 0.01 |
| | $\tau_{22}$ | 1 | 0 | 15 | 1.1 |
| | $\tau_{23}$ | 2 | 0 | 40 | 0.6 |
| | $\tau_{24}$ | 3 | 0 | 30 | 0.6 |
| | $\tau_{25}$ | 4 | 0 | 30 | 0.8 |
| $B$ | $m_1$ | 0 | 0 | 10 | 0.27 |
| | $m_2$ | 1 | 0 | 10 | 0.27 |
| | $m_3$ | 2 | 0 | 10 | 0.27 |
| | $m_4$ | 3 | 0 | 10 | 0.13 |
| | $m_5$ | 4 | 0 | 10 | 0.27 |
| | $m_6$ | 5 | 0 | 10 | 0.27 |

*FIG. 3*

```
Algorithm:RT(taskParams, j, t)
/* Task i = (T_i, E_i, D_i, O_i)                                              */
if j == 1 (highest priority task) then
    return E_j;
end
else
    spill = 0;
    for k ∈ hp(j) in the lowest to highest priority order do
        if there is no release of task k before time t then
            O'_k = O_k - t;    /* does not effect spill, but set the relative offset of this
                                  task, to be used in Tindell's equation */
        end
        else if there is a release of task k exactly at time t then
            O'_k = 0;  /* does not effect spill, but set the relative offset of this task  */
        end
        else
            r_k = latest release time of task k before time t;
            O'_k = r_k + T_k - t;                           /* relative offset  */
            if spill == 0 then
                /* If spill were > 0, then k's interference would already be taken into
                   account by the lower priority task                              */
                rt = RT(k, r_k);   /* response time of task k released at time r_k */
                if r_k + rt > t (if spilling) then
                    spill = r_k - rt - t;
                    spilldutotask = k;          /* max. spill occurred due to task k */
                end
            end
        end
    end
    for task h such that h < spilldutotask do
        while O'_k < spill do
            O'_k = O'_k + T_k;       /* ignore instances already considered in spill */
        end
    end
    /* Compute the response time of task j released at time t taking into account the
       spill                                                                      */
    w = spill + E_j + Σ_{ℓ∈hp(j)} ⌈(w - O'_ℓ)/T_ℓ⌉ 0 * E_ℓ       /* Tindell's equation */ return w;
end
```

| ECU/Bus | $o_i$ | $\pi_i$ | $O_i$ (ms) | $P_i$ (ms) | $E_i$ (ms) | $BCRT_i$ (ms) | $WCRT_i$ (ms) |
|---|---|---|---|---|---|---|---|
| $E_1$ | $\tau_1$ | 0 | 0 | 10 | 0.01 | 0.01 | 0.01 |
| | $\tau_2$ | 1 | 0 | 10 | 0.01 | 0.02 | 0.02 |
| | $\tau_3$ | 2 | 0 | 15 | 0.8 | 0.8 | 0.82 |
| | $\tau_4$ | 3 | 0 | 40 | 1.4 | 1.42 | 2.22 |
| | $\tau_5$ | 4 | 0 | 30 | 0.2 | 1.02 | 2.42 |
| | $\tau_6$ | 5 | 0 | 15 | 0.6 | 1.4 | 3.02 |
| $E_2$ | $\tau_7$ | 0 | 0 | 100 | 0.028 | 0.028 | 0.028 |
| | $\tau_8$ | 1 | 0 | 50 | 0.463 | 0.463 | 0.491 |
| | $\tau_9$ | 2 | 0 | 10 | 0.017 | 0.017 | 0.508 |
| | $\tau_{10}$ | 3 | 0 | 10 | 0.363 | 0.38 | 0.871 |
| | $\tau_{11}$ | 4 | 0 | 10 | 0.287 | 0.667 | 1.158 |
| | $\tau_{12}$ | 5 | 0 | 10 | 6.569 | 7.236 | 7.727 |
| | $\tau_{13}$ | 6 | 0 | 10 | 0.01 | 7.246 | 7.737 |
| $E_3$ | $\tau_{14}$ | 0 | 0 | 100 | 0.01 | 0.01 | 0.01 |
| | $\tau_{15}$ | 1 | 0 | 50 | 0.01 | 0.01 | 0.02 |
| | $\tau_{16}$ | 2 | 0 | 10 | 0.02 | 0.02 | 0.04 |
| | $\tau_{17}$ | 3 | 0 | 10 | 0.01 | 0.03 | 0.05 |
| | $\tau_{18}$ | 4 | 0 | 10 | 0.01 | 0.04 | 0.06 |
| | $\tau_{19}$ | 5 | 0 | 10 | 0.01 | 0.05 | 0.07 |
| | $\tau_{20}$ | 6 | 0 | 10 | 0.01 | 0.06 | 0.08 |
| $E_4$ | $\tau_{21}$ | 0 | 0 | 10 | 0.01 | 0.01 | 0.01 |
| | $\tau_{22}$ | 1 | 0 | 15 | 1.1 | 1.1 | 1.11 |
| | $\tau_{23}$ | 2 | 0 | 40 | 0.6 | 0.61 | 1.71 |
| | $\tau_{24}$ | 3 | 0 | 30 | 0.6 | 1.71 | 2.31 |
| | $\tau_{25}$ | 4 | 0 | 30 | 0.8 | 2.51 | 3.11 |
| $B$ | $m_1$ | 0 | 0 | 10 | 0.27 | 0.27 | 0.54 |
| | $m_2$ | 1 | 0 | 10 | 0.27 | 0.27 | 0.81 |
| | $m_3$ | 2 | 0 | 10 | 0.27 | 0.27 | 1.08 |
| | $m_4$ | 3 | 0 | 10 | 0.13 | 0.13 | 1.21 |
| | $m_5$ | 4 | 0 | 10 | 0.27 | 0.27 | 1.48 |
| | $m_6$ | 5 | 0 | 10 | 0.27 | 0.27 | 1.48 |

FIG. 10B

| No. | FT (ms) |
|---|---|
| 1. | 150.02 |
| 2. | 110.02 |
| 3. | 60.02 |
| 4. | 60.02 |
| 5. | 50.02 |

FIG. 10C

| No. | MA (ms) |
|---|---|
| 1. | 240.02 |
| 2. | 150.02 |
| 3. | 150.02 |
| 4. | 150.02 |
| 5. | 140.02 |

TIMING ANALYSIS USING FORMAL METHODS

TECHNICAL FIELD

The invention relates generally to timing analysis of embedded systems using formal methods, and in particular to a computer executable method for formal modeling and timing analysis of a system described using calendar automata.

BACKGROUND

Existing methods used for the timing analysis of embedded systems include analytical, simulation-based and stochastic methods. These methods provide imprecise analysis. Analytical methods using schedulability analysis and Real Time Calculus give safe approximations. However since they cannot handle some operational details of the system under consideration and do not compute the reachable states in a model of the system, the results can be very pessimistic. Stochastic methods are good for average case analysis, but are not suitable for worst-case analysis. Further, these methods do not allow deterministic modeling of arbitrary scheduling algorithms and controller buffer policies, which influence actual results. Additionally, existing analytical and stochastic analysis tools do, not provide good solutions for timing synchronization problems, because these problems involve simultaneous analysis of multiple event chains which are beyond the capabilities of these methods. Simulation based methods can handle operational details. However, they do not guarantee coverage of corner cases during system simulation and timing measurements, thus possibly giving optimistic results.

Formal methods-based tools and methods for timing analysis exist but have not been scalable to large industrial examples. For example, formal methods based on timed automata cannot address the large amount of data associated with a complex system and typically fail due to the large memory and time required to complete the analysis. With the increasing complexity of electrical systems, such as automotive electrical systems comprising multiple electronic control units (ECUs) communicating via multiple controller area network (CAN) buses, scalable timing analysis methods and tools capable of analyzing these complex systems with precision and accuracy are needed.

SUMMARY

A method and system are provided herein for performing timing analysis of an embedded system including at least one electronic control unit (ECU) and/or at least one bus. The method includes providing a system description, providing an analysis specification for the system, automatically generating a formal model of the system using a model generator, analyzing the formal model of the system using a model checker, and providing results of the analysis. The system description may include task parameters describing tasks, message parameters describing messages, dependency relationships among the tasks and the messages, and other details of the system. The formal model may include a calendar automaton model and instrumentation.

Analyzing the formal model of the system may include analyzing response times of the tasks and the messages, analyzing end-to-end latency of task/message chains, and/or analyzing timing synchronization in task/message graphs. The method and system may further include providing scheduling policies for ECUs or buses included in the system; and providing rules for event activation which may include at least one rule pertaining to a timed transition or a discrete transition.

The model may be optimized using one or more optimization techniques, to reduce or optimize the state-space of the model to enable efficient state-space exploration. For example, the model may be optimized by dynamically computing response time of a task or of a message; by using the analysis specification to filter a portion or part of the system description that is independent of or not critical to the analysis specification; or by applying a combination of these techniques.

The above features and advantages and other features and advantages of the present invention are readily apparent from the following detailed description of the best modes for carrying out the invention when taken in connection with the accompanying drawings.

BRIEF DESCRIPTION OF THE DRAWINGS

FIG. 1 is a flow chart describing a method for timing analysis using formal methods;

FIG. 2 is schematic graphical representation of an illustrative example of an embedded system;

FIG. 3 is a table of task/message allocations and parameters of the system of FIG. 2;

FIG. 4 is a table of task/message chains in the system of FIG. 2;

FIG. 6 is a formal model of a discrete transition rule for event ready expressed in calendar automaton;

FIGS. 7A, 7B and 7C represent first, intermediate, and last tasks in a chain, respectively;

FIG. 9 is an algorithm for computing spill according to the method of FIG. 1; and FIGS. 10A, 10B and 10C are illustrative examples of representative results of a timing analysis of the system of FIGS. 2, 3 and 4 performed according to the method of FIG. 1.

DETAILED DESCRIPTION

Figure 5A:
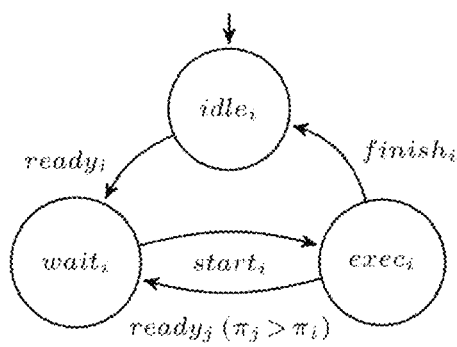
FIGS. 5A and 5B are graphical models of rules for state changes on event activation for tasks and messages, respectively.

A method and tools are provided for performing precise timing analyses which are scalable to industrial case studies having a large number of tasks and messages without trading off accuracy. The method and tools provided herein include the capability to model and analyze task response times, including best case and worst case task response times and schedulability analysis; electronic control unit (ECU) usage including percentage usage of ECU computation time; message response times, including best case and worst case message response times and schedulability analysis; bus usage including percentage usage of bus and idle time availability; end-to-end latency for task/message chains, including first in-first out (FIFO), first in-last out (FILO), last in-first out (LIFO), last in-last out (LILO) end-to-end latencies; timing synchronization problems among task graphs; maximum time separation between multiple destinations starting from a single source; and maximum time separation between multiple sources leading to the same destination.

In the method described herein, system tasks and messages are modeled in a formal notation or formalism, such as calendar automaton. The models are written in a modeling language such as Process Meta Language (Promela). Further, the models are instrumented with code using formal notation and specifically designed to address the analysis under scope. The models along with the instrumentation are automatically generated from, at least, task/message descriptions and scheduling policies. Other operational details such as controller buffer policies can also be included in or supplied as models. Optimization techniques may be used to further optimize the state space for model checking. The modeled system is subjected to exhaustive state space exploration by a compatible model checker, such as Simple Promela Interpreter (SPIN). During exploration, the instrumented code produces results for different timing analyses which are recorded and outputted by a report generator as analysis results which may include witnesses.

Benefits of the method, model and tools provided herein include high precision achieved by the analysis due to the detailed operational models of the system described using mathematical formalisms and exhaustive state space exploration. Scalability is achieved due to the use of discrete event model, in particular the use of calendar automaton formalism, and careful design of the models, which in an exemplary embodiment are Promela models, which exploit many regular features of task-based architectures. The formal models are optimized to achieve scalability without trading off accuracy.

Advantages of the method and tools provided herein include automatic model generation and analysis; the capability to handle and incorporate operational details such as controller buffer policies and specific scheduling algorithms in system design; and the capability to perform simultaneous analysis of multiple task/message chains to detect timing synchronization problems. Further, the method and tools provide improved precision due to exhaustive state-space exploration capability, scalability to large systems with accuracy, and the ability to produce scenarios and simulation traces, also referred to as witnesses, witness paths or witness traces, that can be used to identify the causes of timing requirement violations.

Fundamental to the present invention is the use of calendar automaton model and its instrumentation for different timing analyses, and optimizing the encoding of calendar automaton model to reduce the state-space which must be explored, which allows modeling and analysis to be run within a reasonable amount of time and within reasonable memory requirements.

The method and tools for timing analysis using formal methods as described herein can also be used for the analysis of any system, including embedded systems which may be automotive or non-automotive systems. The method and tools described herein may be used to satisfy current and anticipated Automotive Open System Architecture (AUTOSAR) requirements and specifications for automotive software architecture, some of Which, e.g., timing synchronization problems, cannot be addressed precisely or accurately with existing analytical, simulation-based or stochastic tools.

Referring to FIG. 1, generally indicated at 100 is a method for timing analysis using formal models. A system description 10 is provided which describes the architectural details of the embedded system to be analyzed. In an exemplary embodiment, the embedded system is an electrical control system of an automobile, which is comprised of a plurality of electronic control units (ECUs) connected by one or more controller area network (CAN) buses.

Referring to FIG. 2, shown as an illustrative example is a graphical representation of an embedded system including a set of ECUs designated as $E_1$ through $E_4$ and a bus B. A set of tasks is deployed on each ECU, and different sets of tasks are deployed on different ECUs. For example, tasks $\tau_1$ and $\tau_2$ are deployed on ECU $E_1$, as shown in FIG. 2. A set of messages associated with tasks are propagated on a bus. For example, messages $m_1$ through $m_5$ are assigned to bus B shown in FIG. 2. Each task is described by a tuple, where a tuple is an ordered list of parameters describing the task. For example, each task may be described by a tuple such as <priority, initial offset, period, execution time>. Each message is described by a similar tuple. The table shown in FIG. 3 shows task/message allocations to ECUs/buses and task/message descriptions in tuple form, including a task/message name ($o_i$) for each task $\tau_i$ or message $m_j$, a priority ($\pi_i$), an initial offset ($O_i$), period ($P_i$) and execution time ($E_i$). The execution time of a task includes the time to read, process and output data. The execution time for a message is the transmission time of the message on a bus and can be computed from bus speed and the size of the message inclusive of bit-stuffing. Other task parameters may be described for each task, such as a deadline by which the task must complete its execution. If all these parameters are included, the task may be described by a tuple such as <ECU, priority, initial offset, period, execution time, deadline>. The message tuple may include parameters such as <bus, ID, initial offset, period, length, deadline>, where each message is described by the bus it is assigned to, for example a high-speed controller area network (CAN) with a typical baud rate of 500 kilobits per second (kbps) or a low-speed CAN with a typical baud rate of 33.3 kbps, the ID as an expression of priority, the initial offset and period, the message length expressed in bytes, and the deadline expressed as a set amount of time in which the message must reach its destination. A periodic or event-triggered tasks/messages can also be represented using similar tuples.

System description 10 may further specify certain properties or parameters to be input into the model generator, for the purpose of optimizing the encoding of the calendar automaton model such that the state-space of the model to be analyzed is reduced. The data dependency relationships among a set of tasks and messages may be specified, which may include a description of how the data is passed from one task/message to another task/message. The data dependency relationships among a set of tasks and messages of the embedded system are illustrated in FIG. 2 by the directed edges shown in the graph. A directed edge from $\tau_i$ to $\tau_j$ specifies that the output of task $\tau_i$ is an input to task $\tau_j$. As an example, as shown in FIG. 2, in ECU $E_2$, the directed edge from $\tau_7$ to $\tau_{11}$ shows the data-dependency between $\tau_7$ and $\tau_{11}$. A directed edge from $\tau_i$ to $m_j$ specifies that the message $m_j$ contains an output of task $\tau_i$. Similarly, a directed edge from $m_j$ to $\tau_k$ specifies that message $m_j$ contains an input of task $\tau_k$. As an example, in ECU $E_2$, task $\tau_{11}$ outputs message $m_5$, which in turn is an input to task $\tau_2$ in ECU $E_1$. A sample of task/message chains showing the data dependency relationships in the example system of FIG. 2 are summarized in the table shown in FIG. 4.

Figure 5B:
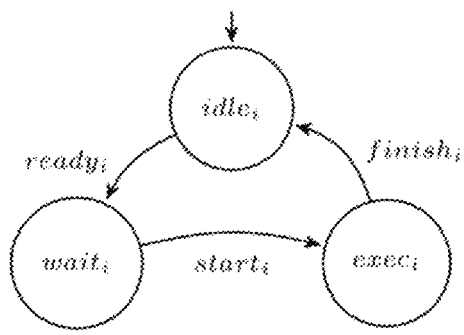

Optimizing the model may include filtering a part of the system description that is independent of the analysis specification, for example, optimizing the encoding may include modeling and/or analyzing only those tasks/messages which are critical to the timing analysis specified, thereby reducing the type and number of events to be included into the discrete event model. Optimizing system model 40 reduces the state-space in comparison to a generic system model by limiting the events in the discrete event model and by instrumenting the model based on analysis specification 20. For example, three events such as ready, start, finish may be modeled for each task or message. Shown in FIG. 5A is an example model of a task $\tau_i$ with three events, and shown in FIG. 5B is an example model of a message $m_i$ with three events.

Events may be encoded to occur at known time points determined from the task/message parameters. For example, the ready, start, finish events of a task $\tau_i$ may be modeled with their activation times for a given analysis specification as:

(ready$_i$, t): task $\tau_i$ will be triggered after t time units from current time (start$_i$, t): task $\tau_i$ will start execution after t time units from current time (finish$_i$, t): task $\tau_i$ will finish execution after t time units from current time Rules may be modeled for activation of selected events. For example, a rule may be provided for time advancement, also known as timed transition, which may be independent of the system description 10 and analysis specification 20. The rule for timed transition may specify that if no event can be activated at current time, advance time to the nearest activation time of any event. A formal model of the timed transition rule may be expressed in calendar automaton as:

$$\begin{aligned}&1.\ \min(C){>}0 \Rightarrow \\ &2.\ \Delta \leftarrow \min(C) \\ &3.\ C \leftarrow C{-}\Delta\end{aligned} \quad (1)$$

where C is a set of all events along with their activation times, min(C) computes the nearest activation time of any event in C, and if min(C)>0, its value is subtracted from activation times of all entries in C.

The rules for event activations, also known as discrete transitions, may be dependent on one or both the system description 10 and analysis specification 20, for example, by depending on message/task tuples, scheduling policies of ECUs/buses, etc. A formal model of the discrete transition rule for event ready may be expressed in calendar automaton as shown in FIG. 6, where C is a set of all events with their activation times, line 1 represents the event activation condition, and lines 2-21 represent implementation of rules for task-ready condition.

Rules or policies may also be modeled for task and message schedulability. Again referring to FIGS. 5A and 5B, for example, the model of the task shown in FIG. 5A or the model of the message shown in FIG. 5B can move from an initial state of idle, once a ready event is activated, to a wait state, and on activation of a start event, go to an exec state. Tasks may be preemptively scheduled, where a task $\tau_i$ can be preempted by a higher priority task $\tau_j$. For example, the task $\tau_i$ illustrated by the graph of FIG. 5A, moves from exec state to wait state when a higher priority task $\tau_j$ is ready to start execution. As illustrated by FIG. 5B, CAN messages typically are non-preemptively scheduled, therefore there is no transition from exec state to wait state for these messages.

Figure 7A:
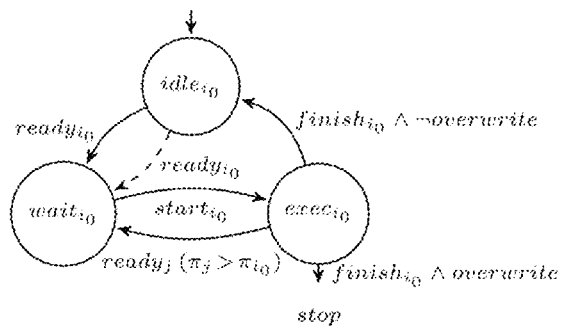
FIGS. 7A, 7B and 7C are graphical models for rules for end-to-end latency analysis of tasks, where
Figure 7B:
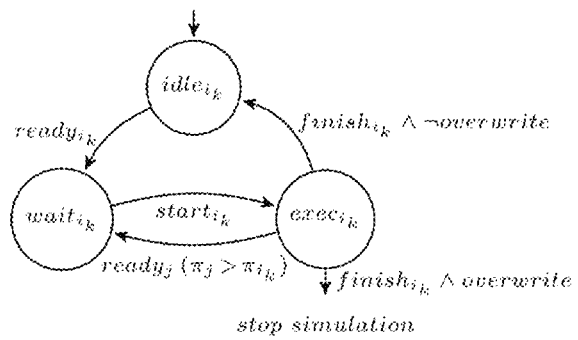
Figure 7C:
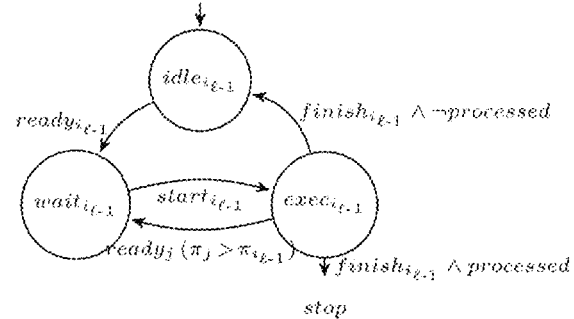

Optimizing the encoding may further include specifying properties such as end-to-end latency or timing synchronization, which are obtained from analysis specification 20. For example, FIGS. 7A, 7B and 7C are graphical models of the rules for end-to-end latency analysis of a chain, where FIGS. 7A, 7B and 7C represent first, intermediate, and last tasks in a chain, respectively. Messages in a chain can be modeled similarly.

Optimizing system model 40 reduces the state-space in comparison to a generic system model by limiting the events in the discrete event model and by instrumenting the model based on analysis specification 20, thus enabling analysis using formal modeling and exhaustive state-space exploration using a model checker.

As shown in FIG. 1, system description 10 is provided to model generator 30 in conjunction with analysis specification 20. Analysis specification 20 describes the specific timing analysis to be completed for the embedded system being modeled and analyzed. The descriptions are formalized using calendar automaton or another formal notation. Analysis specification 20 may address various system parameters and characteristics, including providing for analysis of:

(1) Task response times: Best case and worst case task response times and schedulability analysis;

(2) ECU usage: Percentage usage of ECU computation time;

(3) Message response times: Best case and worst case message response times and schedulability analysis;

(4) Bus usage: Percentage usage of Bus, how much idle time is left;

(5) End-to-end latency for task/message chains: Given a chain of tasks and messages, different end-to-end latencies (e.g., FIFO, FILO, LIFO, LILO);

(6) Timing synchronization problems in task/message graphs;

(7) Maximum time separation between multiple destinations starting from a single source; and/or (8) Maximum time separation between multiple sources leading to the same destination.

Analysis specification 20 may further specify problem specifications and problem parameters to model generator 30, in order to optimize the model by reducing the state-space to be analyzed, e.g., where the scope of events modeled and tested is limited. Analysis specification 20 may typically include specifications to measure the time for event chains, including the following:

Worst case response time of task/message:

$$\langle \text{ready}(t), \text{finish}(t) \rangle \quad (2)$$

End-to-end latency of a task/message chain:

$$\langle \text{ready}(t1), \text{finish}(t1), \text{ready}(t2), \text{finish}(t2), \ldots, \text{ready}(tn), \text{finish}(tn) \rangle \quad (3)$$

Timing Synchronization:

$$\langle \text{ready}(t1), \ldots, \text{finish}(tm) \rangle$$

$$\langle \text{ready}(t1), \ldots, \text{finish}(tn) \rangle \quad (4)$$

Analysis specification 20 may also define deadlines and other details related to the system analysis requirements.

At step 30 shown on FIG. 1, the model generator automatically generates a formal model 40, based on calendar automaton, using the information provided by system description 10 and analysis specification 20 of the system. Formal model 40 may be expressed in Promela or any other suitable modeling language. Formal model 40 has two parts, a system model derived from system description 10 and a property instrumentation or analysis instrumentation derived from analysis specification 20. The formal model may be described by specifying the data dependency relationships among the tasks and the messages for a set of tasks and messages, providing scheduling policies for ECUs or buses included in the system, and providing rules for event activation, wherein the rules for event activation includes at least one rule pertaining to one of a timed transition or a discrete transition. The analysis specification may be used during the formal modeling process to further optimize the system model, to reduce the state space to be analyzed.

Formal model 40 may be further optimized by a variety of optimization techniques. One optimization technique is to filter parts of the system description that are independent of the analysis specification under consideration from the model, to reduce the model's state-space. For example, when the analysis specification is restricted to schedulability analysis for a specific ECU, for example, ECU $E_1$ shown in FIG. 2, then formal model 40 of FIG. 1 may be filtered to include details pertaining to tasks on ECU $E_1$ only.

Figure 8:
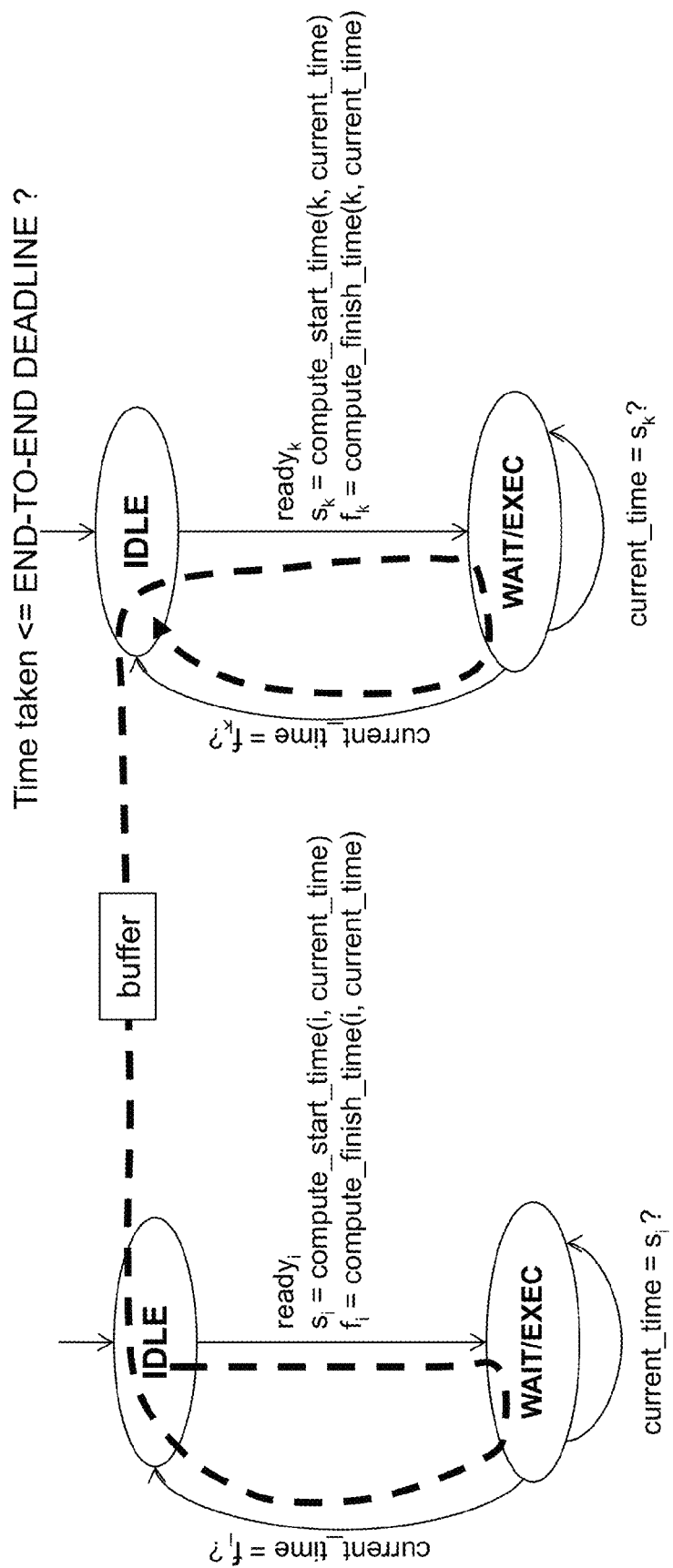
FIG. 8 is a graphical model illustrating on-the-fly computation of task response time.

Another optimization technique provided herein, which may be used for fixed priority preemptive scheduling, and typically for preemptively scheduled tasks, is to compute the task response time dynamically, e.g., on-the-fly. By combining model checking with on-the-fly computation of response times for analysis specifications involving end-to-end latency and/or timing synchronization problems, significant scalability for handling industry sized systems and problems can be enabled. Shown in FIG. 8 is a graphical model illustrating on-the-fly computation of task response time, where it is understood that whenever a task in a chain is activated, for example, at the end of a period, the task reads an input buffer and at the end of a computation, the task updates its output buffer. The updating of the output buffer takes varying time due to delays from higher priority tasks, therefore, the updating time actually equals the response time of a task. The response time of the task can be computed dynamically, e.g. on-the-fly, using the equation:

$$w = \text{spill} + E_j + \sum_{l \in hp(j)} \left\lceil \frac{w - O'_l}{T_l} \right\rceil * E_l \qquad (5)$$

where w represents the computed response time of $\tau_j$, spill is as defined herein, $E_j$ is the worst case execution time of $\tau_j$, hp(j) is the set of all tasks with higher priority than $\tau_j$, $O'_l$ represents the next activation offset of $\tau_l$ from current time, $T_l$ represents the period of $\tau_l$ and $E_l$ represents the worst case execution time of $\tau_l$. Spill, in the above equation and for a given task activation instance, is defined as the remaining execution time of an immediate higher priority task that is in the state of execution, and can be computed using the algorithm shown in FIG. 9. Because spill value is dependent on the different instances of higher priority tasks which were activated when the task under consideration is activated, its computation represents the remaining obligation of higher priority tasks in terms of execution and the computation is therefore non-trivial.

Yet another optimization technique or policy which may be applied to fixed priority non-preemptive scheduling used in a bus, such as a CAN bus similar to the bus B shown in the system of FIG. 2, is to optimize the calendar automaton models by using only two events, a Boolean array tracking the list of ready messages, and a timer variable. The first event is used to track the remaining propagation time of the message that most recently won the arbitration. The second event is a single cyclic timeout event that is sufficient to track periodic activation of all messages on the bus. By using this optimization technique instead of tracking activation time separately for all messages when analyzing worst case response time of messages, the state space required for analyzing the CAN network can be significantly reduced, helping in increasing the scalability.

Referring again to FIG. 1, at step 50 formal model 40 is subjected to exhaustive state space exploration by a model checker to determine if the system model complies with the analysis specification. Model checker 50 is configured to be compatible with model generator 30. For example, for a model generated at steps 30 and 40 in Promela modeling language, model checker 50 may be configured as the Simple Promela Interpreter (SPIN) model checker. Optimization of the model, as discussed previously, permits the model to be explored in a reasonable time and within reasonable memory requirements. During exploration, the instrumented code produces results for the different timing analyses discussed previously, which are summarized as an output in the form of a report at step 60.

The report produced by the report generator at step 60 is in human understandable form, including analysis results 70, and may be used to determine compliance of the design assumptions of system description 10 with the specifications and requirements included in analysis specification 20. Analysis results 70 may include, for example, results as shown in FIGS. 10A, 10B and 10C. Shown in FIG. 10A are analysis results for Best Case Response Times (BCRT) and Worst Case Response Times (WCRT) for each task and message, for example, for each task/message shown in FIG. 3. The table of FIG. 10B provides analysis results for last in-first out (LIFO) delay computations, also referred to as first-through (FT) for each task/message chain specified as an input to model generator 30, for example, for each task/message chain shown in FIG. 4. FIG. 10C shows analysis results for last in-last out (LILO) delay computations, also referred to as max-age (MA) for each task/message chain specified as an input to model generator 30, for example, for each task/message chain shown in FIG. 4.

Analysis results 70 may further include simulation traces, which may also be referred to as witnesses, whenever there is a violation of timing constraints or specifications during the state space exploration. These simulation traces can be used to assist in debugging by localizing the cause of analysis failures and identifying parameter changes to resolve the anomaly. The system architecture can be redesigned to ensure timing constraints are addressed and the redesigned architecture can be modeled and analyzed to confirm the anomaly recorded by the witness has been eliminated.

The ability to model and perform an exhaustive state space exploration of a system provides the advantage of early analysis such that issues found during modeling can be used to correct or improve the architectural design of the system, including changes to the bus/ECU design and task/message allocation, optimizing ECU/bus usage, performing schedulability analysis, optimizing message and task response times and resolving timing synchronization problems in task/message graphs, to ensure timing requirements are met and to optimize the system architecture. These system changes can be easily reassessed in a timely manner by incorporating the changes into system description 10 and analysis specification 20 and repeating steps 30 through 60 to determine the impact of the changes.

While the best modes for carrying out the invention have been described in detail, those familiar with the art to which this invention relates will recognize various alternative designs and embodiments for practicing the invention within the scope of the appended claims.

The invention claimed is:
1. A method for performing timing analysis of an embedded system comprising:
   providing a system description;
   providing an analysis specification for the system;
   automatically generating a formal model of the system from the system description and the analysis specification using a model generator;
   wherein the formal model includes a calendar automaton model and instrumentation;
   analyzing the formal model of the system using a model checker;

optimizing the calendar automaton model by at least one of:
computing a spill time associated with a task; and
dynamically computing response time of the task using the spill time;
wherein $$w = \text{spill} + E_j + \sum_{l \in hp(j)} \left\lceil \frac{w - O'_l}{T_l} \right\rceil * E_l$$

where w represents the computed response time of $\tau_j$, $E_j$ is the worst case execution time of $\tau_j$, hp(j) is the set of all tasks with higher priority than $\tau_j$, $O'_l$ represents the next activation offset of $\tau_l$ from current time, $T_l$ represents the period of $\tau_l$ and $E_l$, represents the worst case execution time of $\tau_l$, Spill, for a given task activation instance, is defined as the remaining execution time of an immediate higher priority task that is in the state of execution; and
providing results of the analysis.

2. The method of claim 1, wherein providing the system description includes:
providing task parameters for a task;
providing message parameters for a message; and
providing data dependencies among a set of tasks and messages.

3. The method of claim 1, wherein analyzing the formal model of the system using a model checker includes at least one of:
specifying the analysis to be performed using the analysis specification;
analyzing response time of a task;
analyzing response time of a message;
analyzing end-to-end latency of a task/message chain; and
analyzing timing synchronization in a task/message graph.

4. The method of claim 1, wherein analyzing the formal model of the system using a model checker includes at least one of:
dynamically computing a response time of the task; and
dynamically computing a response time of the message.

5. The method of claim 1,
wherein the embedded system includes an electronic control unit (ECU) and a bus, the method further comprising at least one of:
providing a scheduling policy for the ECU; and
providing a scheduling policy for the bus.

6. The method of claim 1, further comprising:
providing a rule for event activation;
wherein the rule for event activation pertains to one of a timed transition and a discrete transition.

7. The method of claim 1, wherein the results of the analysis includes one of a witness path and simulation trace.

8. The method of claim 1, further comprising:
filtering the formal model using the analysis specification to exclude portions of the system description that are independent of the analysis specification from the model.

9. A method for performing timing analysis of an automotive system comprising:
providing a system description;
providing an analysis specification for the system;
automatically generating a formal model of the system including a calendar automaton model and instrumentation;
analyzing the formal model of the system using a model checker;

wherein the system includes a plurality of electronic control units (ECUs) connected by one or more buses, the method further comprising:
providing scheduling policies for the plurality of ECUs and for the one or more buses; and
analyzing percentage usage of ECU computation time; and
providing results of the analysis.

10. The method of claim 9, further comprising:
optimizing the calendar automaton model by at least one of:
dynamically computing response time of a task;
dynamically computing response time of a message; and
filtering the system description using the analysis specification.

11. The method of claim 9, wherein providing the system description includes:
describing a task by a tuple;
describing a message by a tuple; and
specifying data dependency relations among a set of tasks and messages.

12. The method of claim 9, wherein analyzing the formal model of the system using a model checker includes at least one of:
specifying the analysis to be performed using the analysis specification;
analyzing response time of a task;
analyzing response time of a message;
analyzing end-to-end latency of a task/message chain; and
analyzing timing synchronization in task/message graphs.

13. The method of claim 9, further comprising:
providing one or more rules for event activation, wherein the one or more rules includes a rule pertaining to one of a timed transition and a discrete transition.

14. A system for performing timing analysis of an embedded system, the system comprising:
a computer;
an embedded system description including a task and a message;
an analysis specification for the embedded system;
a formal model generator, wherein the formal model generator is configured to generate a formal model of the embedded system and the analysis specification;
wherein the formal model includes a calendar automaton model and instrumentation;
wherein the embedded system includes a plurality of electronic control units (ECUs) connected by one or more buses, further comprising:
an optimized calendar automaton model, wherein:
the optimized calendar automaton model includes no more than two events;
one of the two events is a Boolean array tracking a list of ready messages; and
the other of the two events is a single cyclic timeout event configured to track periodic activation of messages on the one or more buses; and
a model checker configured to analyze the formal model and provide results of the analysis.

15. The system of claim 14, further comprising:
an optimized calendar automaton model, wherein the optimized calendar automaton model includes one of:
a dynamic computation of response time of a task;
a dynamic computation of response time of a message; and
wherein the optimized calendar automaton model is defined by filtering the embedded system description using the analysis specification.

16. The system of claim 14,
wherein the model generator is a Promela model generator; and wherein the model checker is SPIN model checker.

17. The system of claim 14, wherein the embedded system includes a plurality of electronic control units (ECUs) connected by one or more buses, further comprising:
- a set of scheduling policies for the plurality of ECUs and for the one or more buses; and
- a set of rules for event activation, wherein the set of rules for event activation includes a rule pertaining to one of a timed transition and a discrete transition.

* * * * *